US006380038B1

(12) United States Patent
Yu

(10) Patent No.: US 6,380,038 B1
(45) Date of Patent: Apr. 30, 2002

(54) TRANSISTOR WITH ELECTRICALLY INDUCED SOURCE/DRAIN EXTENSIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/703,512

(22) Filed: Oct. 30, 2000

(51) Int. Cl.[7] .................... H01L 21/336; H01L 21/425

(52) U.S. Cl. .................... 438/300; 438/303; 438/305; 438/507; 438/546

(58) Field of Search .................... 438/299, 300, 438/301, 303, 305, 527, 546; 257/408, 344, 397, 346

(56) References Cited

U.S. PATENT DOCUMENTS

| | | | | |
|---|---|---|---|---|
| 4,868,617 A | * | 9/1989 | Chiao et al. | 357/23.3 |
| 5,496,750 A | * | 3/1996 | Moslehi | 437/41 |
| 6,160,299 A | * | 12/2000 | Rodder | 257/408 |
| 6,180,464 B1 | * | 1/2001 | Krivokapic et al. | 438/289 |
| 6,198,142 B1 | * | 3/2001 | Chau et al. | 257/408 |
| 6,214,679 B1 | * | 4/2001 | Murthy et al. | 438/299 |
| 6,218,711 B1 | * | 4/2001 | Yu | 257/384 |
| 6,248,637 B1 | * | 6/2001 | Yu | 438/300 |
| 2001/0033000 A1 | * | 10/2001 | Mistry | 257/339 |
| 2001/0036713 A1 | * | 11/2001 | Rodder et al. | 438/514 |

* cited by examiner

*Primary Examiner*—Michael S. Lebentritt
(74) *Attorney, Agent, or Firm*—Foley & Lardner

(57) ABSTRACT

A method of fabricating an integrated circuit provides a transistor having less susceptibility to short channel effects. The transistor utilizes a U-shaped gate conductor and a main gate conductor. The U-shaped gate conductor can provide electrically induced source/drain extensions. The transistor can be a PMOS or NMOS transistor.

5 Claims, 2 Drawing Sheets

TRANSISTOR WITH ELECTRICALLY INDUCED SOURCE/DRAIN EXTENSIONS

CROSS REFERENCE TO RELATED APPLICATIONS

The present application is related to U.S. patent application Ser. No. 09/372,705, entitled "Transistor with Dynamic Source/Drain Extensions," filed by Yu on Aug. 11, 1999, and assigned to the assignee of the present application.

FIELD OF THE INVENTION

The present invention relates to integrated circuits (ICs) and methods of manufacturing integrated circuits. More particularly, the present invention relates to a transistor and a method of manufacturing the transistor. The transistor is advantageously less susceptible to short channel effects.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include conducive gates disposed between drain and source regions. The drain and source regions are typically heavily doped with a P-type dopant (boron) or an N-type dopant (phosphorous).

The drain and source regions generally include a thin or shallow extension that is disposed partially underneath the gate to enhance the transistor performance. Shallow source and drain extensions help to achieve immunity to short-channel effects, which degrade transistor performance for both N-channel and P-channel transistors. Short-channel effects are among the most important scaling issues for mainstream CMOS technology and can cause threshold voltage roll-off and drain-induced barrier lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion-implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 nanometer (nm) junction depth). Forming source and drain extensions with junction depths of less than 30 nm is very difficult using conventional fabrication techniques.

Conventional ion-implantation and diffusion-doping techniques make transistors on the IC susceptible to short-channel effects, which result in a dopant profile tail distribution that extends deep into the substrate. Also, conventional ion-implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically into the bulk semiconductor substrate.

Furthermore, as transistors disposed on integrated circuits (ICs) become smaller (e.g., transistors with gate lengths approaching 70 nm or less), source and drain extension depths need to be aggressively reduced to achieve acceptable immunity to the short-channel effect. For example, a transistor having a gate length of less than 70 nm should have an ultra-shallow source/drain extension (e.g., depth of 10–20 nm). However, the formation of the ultra-shallow source/drain extension is very difficult with conventional ion implantation and thermal annealing techniques. For example, ultra-shallow source/drain extensions are susceptible to significant dopant loss during the low-KeV implantation, as well as to increased transient-enhanced diffusion (TED), which make the junction depth much deeper. These problems can prevent the manufacture of a ULSI integrated circuit having transistors with gate lengths of less than 50 nm.

Another important factor associated with reduced transistor size relates to transistor leakage current. As the physical length of the gate is reduced to increase the transistor on-state drive current, the spacing between the source and drain extensions becomes closer. The off-state leakage current dramatically increases as the source/drain extensions become closer. Increased off-state leakage current increases the power consumption and heat generated by an integrated circuit.

Thus, there is a need for a transistor that has source and drain extensions that are not formed by conventional processes. Further still, there is a need for a transistor with less susceptibility to short-channel effects. Further still, there is a need for source/drain extensions that do not contribute significantly to off-state leakage current. Even further still, there is a need for a method of making a novel transistor structure that is less susceptible to short channel effects.

SUMMARY OF THE INVENTION

One exemplary embodiment relates to a transistor with electrically induced source/drain extensions. The transistor includes a source, a drain, and a gate structure. The gate structure is disposed between the source and the drain and has a first gate electrode and a second gate electrode. The second gate electrode provides the electrically induced source/drain extensions. The first gate electrode turns the transistor on when a signal or voltage is applied to the first gate electrode.

Another exemplary embodiment relates to a circuit comprising a transistor having a gate electrode means for receiving a gate signal. The transistor is in an on state in response to a gate signal having a first level and is in an off state in response to the gate signal having a second level. Source/drain extensions are formed in response to a gate bias.

Yet another exemplary embodiment relates to a method of fabricating an integrated circuit on a substrate. The integrated circuit includes at least one transistor with electrically induced source/drain extensions. The method includes providing a first gate conductor on a substrate, providing a dielectric layer over the first gate conductor, and providing a second gate conductor over the dielectric layer above the first gate conductor. The second gate conductor is capable of forming electrically induced source/drain extensions.

Still another exemplary embodiment relates to a transistor. The transistor includes a source region, a drain region, and a gate structure. The gate structure is disposed between the source region and the drain region. The transistor is in an on state in response to a gate signal having a first level and is in an off state in response to the gate signal having a second level. The gate structure includes a first gate electrode for forming the source and drain extensions and a second gate electrode for receiving the gate signal.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EXEMPLARY EMBODIMENTS

Figure 1:
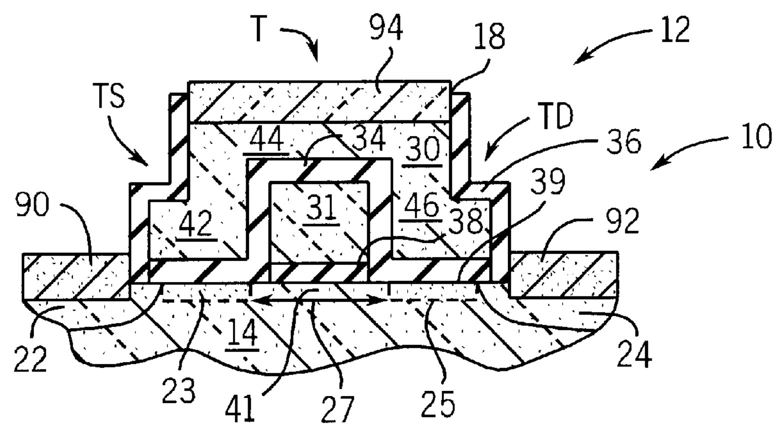
FIG. 1 is a schematic cross-sectional view of a portion of an integrated circuit including a transistor with electrically induced source/drain extensions in accordance with an exemplary embodiment.

FIG. 1 shows an advantageous transistor structure with ultra-shallow, electrically induced source/drain extensions. FIGS. 1–8 illustrate an advantageous complementary metal oxide semiconductor (CMOS) fabrication process for forming the advantageous transistor structure on a substrate. The advantageous process and operation of the transistor structure is described below, with reference to FIGS. 1–8, as follows.

With reference to FIG. 1, a transistor 12 is disposed on a semiconductor substrate 14, such as, a single crystal silicon wafer. Transistor 12 is part of a portion 10 of an integrated circuit (IC) manufactured on an IC wafer. Transistor 12 preferably has a gate length of less than 70 nanometer (nm) (e.g., approaching 50 nm).

Substrate 14 can be any semiconductor material, including gallium arsenide (GaAs), silicon (Si), germanium (Ge), or other material. Alternatively, substrate 14 can be a thin-film or an epitaxial layer that is part of a silicon-on-insulator substrate.

Transistor 12 includes a gate stack or structure 18, a source region 22, and a drain region 24. Transistor 12 also includes an electrically induced source extension 23 and an electrically induced drain extension 25, respectively. Extensions 23 and 25 are “electrically induced” in that they are formed at least in part from an electrical field associated with gate structure 18. In the exemplary embodiment, source region 22 and drain region 24 are 60–120 nm deep (60–120 nm below a top surface 39 of substrate 14).

Transistor 12 can be an N-channel or a P-channel field effect transistor (FET). Source and drain regions 22 and 24, respectively, can be planar (e.g., located entirely within substrate 14), as shown in FIG. 1, or can be raised or elevated source and drain regions. Source and drain regions 22 and 24, respectively, have a concentration of $10^{19}$ to $10^{20}$ dopants per cubic centimeter.

Dynamic or electrically induced source and drain extensions 23 and 25, respectively, are preferably ultra-shallow extensions (e.g., junction depth is less than 30 nm, (10–20 nm or 5–10 nm)), which are thinner (i.e., shallower) than corresponding source and drain regions 22 and 24, respectively. When present, each of electrically induced source and drain extensions 23 and 25 has a width of 150–3000 Å (from left-to-right) (most preferably, 500–600 Å) and is integral with corresponding source and drain regions 22 and 24, respectively. Electrically induced source and drain extensions 23 and 25, respectively, are disposed partially underneath a gate structure 18. Electrically induced source and drain extensions 23 and 25 help transistor 12 achieve substantial immunity to short-channel effects.

Extensions 23 and 25 are formed under gate structure 18 as an inversion layer (e.g., accumulation mode). The induced inversion layer acts as an electrical extension of source region 22 and drain region 24. Generally, the thickness of the inversion layer (extensions 23 and 25) can be very thin (e.g., less than 1000 Å) for providing good immunity to short-channel effects. The inversion layer is not provided in a channel region 41 centered under structure 18. Channel region 41 preferably has a concentration of $10\times10^{17}$–$1\times10^{18}$ p-type dopants. The locations associated with extensions 23 and 25 can have the same dopant characteristics of channel region 41.

Gate structure 18 is configured so that transistor 12 forms electrically induced source and drain extensions 23 and 25, respectively, in response to a bias. The bias is generally provided when power is provided to portion 10 of IC. Thus, when IC is on, extensions 23 and 25 are present. In this embodiment, extensions 23 and 25 are permanently present when the IC is operational even though extensions 23 and 25 are not formed in a conventional doping process.

Gate structure 18 includes a U-shaped electrode or conductor 30, a main gate electrode 31, a high-K dielectric layer 34, spacers 36, and a gate dielectric layer 38. U-shaped conductor 30 receives the bias which electrically induces the formation of extensions 23 and 25. U-shaped conductor 30 is configured as a “horseshoe” shaped conductor over main gate electrode 31 (e.g., surrounds main gate electrode 31 on at least three sides). Main gate electrode 31 prevents the inversion layer from being induced directly beneath it. U-shaped conductor 30 includes a first wing 42, a center portion 44, and a second wing 46.

U-shaped conductor 30 controls a first parasitic transistor (TS) associated with wing 42, and a second parasitic transistor (TD) associated with wing 46. Main gate electrode 31 controls a main transistor (T). The first parasitic transistor (TS) is associated with extension 23; extension 23 is formed when the bias is provided on wing 42. The second parasitic transistor (TD) is associated with extension 25; extension 25 is formed when the bias is provided on wing 46. Main gate electrode 31 controls the turning on and off of transistor 12.

Center portion 44 of U-shaped gate conductor 30 serves to connect wings 42 and 46 and can be eliminated (if other connective structures are available on portion 10 of the IC). A channel length of transistor 12 is a distance 27 between extensions 23 and 25 when extensions 23 and 25 are present. Distance 27 is preferably less than 2,000 Å (e.g., 20 nm–200 nm).

Dielectric layer 34 of transistor 12 advantageously has a high dielectric constant (K) value. For example, layer 34 can be formed from a material having a K value of greater than 20 (preferably, greater than 25). Layer 34 can be a high-K dielectric material, such as, titanium dioxide ($TiO_2$), tantalum pentaoxide ($Ta_2O_5$), aluminum oxide ($Al_2O_3$), or other insulators. Layer 34 can also be a composite of several insulating layers made from different materials (e.g., $S_iO_2$, $TiO_2$, $Ta_{2x}O_5$, $Si_3N_4$, $Al_2O_3$, etc.).

Dielectric layer 34 is between main gate electrode 31 and U-shaped gate electrode 30. Layer 34 can have a width of 350–5000 Å and a thickness of 100–200 Å. The equivalent oxide thickness (EOT) of layer 34 is thinner than that of gate dielectric 38 so that U-shaped conductor 30 induces the inversion layer for extensions 23 and 25. Preferably, the EOT is configured so conductor 30 induces the formation of extensions 23 and 25 when any bias is provided to conductor 30 (e.g., even with a zero voltage signal). The bias with respect to substrate 12 (e.g., −2 volts) allows extensions 23 and 25 to be formed when the voltage on conductor 30 is zero.

Gate structure 18 is preferably 1500–3000 Å thick (i.e., height) and 35–500 nm wide. Gate dielectric layer 38 is preferably a very thin (20–30 Å) silicon dioxide material formed in a deposit-and-etch process. Alternatively, gate dielectric layer 38 can be thermally grown.

U-shaped conductor 30 is preferably a conductive material, such as, doped polysilicon, doped polysilicon/germanium, tungsten, titanium nitride, molybdenum, or other metal conductor. Conductor 30 is 300–500 Å thick at center portion 44 (from a bottom of a silicide layer 94 to a top of dielectric layer 34). Center portion 44 is 30–480 nm wide. Each of first and second wings 42 and 46, respectively, preferably has a width of 15–300 nm and a maximum thickness of 1500–3000 Å (from layer 94 to layer 34).

Main gate electrode 31 is preferably a conductive material, such as, doped polysilicon, doped polysilicon/germanium, tungsten, titanium nitride, molybdenum, or other metal conductor. Conductor 31 is preferably 1000–2000 Å in height and 20–200 nm wide. Main conductor 31 is provided over gate dielectric 38.

In operation, electrically induced source and drain extensions 23 and 25, respectively, are formed by inversion layers related to parasitic transistors (TS) and (TD) associated with first and second wings 42 and 46, respectively. By utilizing high-K dielectric layer 34, deep inversion layers are formed which can act as source and drain extensions 23 and 25 when the appropriate gate bias is provided to conductor 30. The gate bias can be 0V, 1V, 2V, 3V, etc. Design parameters and system criteria can affect the selection of the appropriate gate bias for extensions 23 and 25.

In one alternative embodiment, electrically induced source and drain extensions 23 and 25 can be controlled so that extensions 23 and 25 do not significantly contribute to on-state leakage current. In such an alternative embodiment, source and drain extensions 23 and 25, respectively, are present when or just before, transistor 12 is turned on. Preferably, when a gate signal is provided to gate structure 18 that turns transistor 12 on, electrically induced source and drain extensions 23 and 25 are present. Extensions 23 and 25 can be induced by the gate signal or by a separate bias signal provided when the gate signal is provided.

When a gate signal that turns transistor 12 off is provided to gate structure 18, extensions 23 and 25 are absent (e.g., disappear). Extensions 23 and 25 can be removed by removing the bias signal, (i.e., making the bias signal equal to the substrate bias signal). Thus, transistor 12 can present an advantageous structure that has dynamic source/drain extensions 23 and 25.

Such an embodiment can slow the operational speed of transistor 12 due to the parasitic capacitance associated with periodically providing extensions 23 and 25. Transistor 12, according to this alternative embodiment, is preferably employed in regions of IC 10 which are concerned with low leakage current and which do not require significant transistor speed.

Transistor 12 can be designed to be in the on-state at various voltage levels (e.g., for N-channel MOSFET: gate voltage equals VDD or supply voltage; for P-channel MOSFET: gate voltage equals VSS or ground). Alternatively, other voltage levels could be utilized, depending upon device parameters.

With reference to FIGS. 2–6, the fabrication of transistor 12, including gate structure 18, is described below as follows. Conventional CMOS processes are utilized to form most of the elements of transistor 12 shown in FIG. 2.

Figure 2:
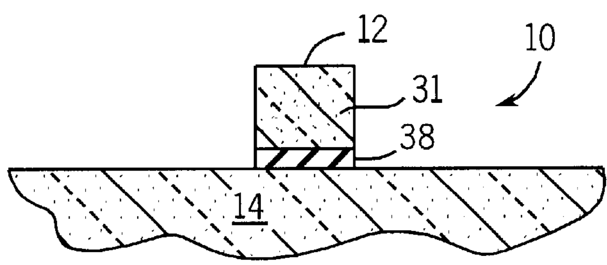
FIG. 2 is a schematic cross-sectional view of the portion of the integrated circuit illustrated in FIG. 1, showing a first electrode gate formation step.

With reference to FIG. 2, in an exemplary embodiment, substrate 14 includes a thin gate dielectric layer that is covered with a polysilicon layer. The polysilicon layer and the gate dielectric layer are etched to leave gate dielectric layer 38 and main gate conductor 31.

Gate dielectric layer 38 is preferably 20–30 Å thick and is thermally grown or deposited on substrate 14. Layer 38 is 20–200 nm wide after etching. Main gate conductor 31 is preferably deposited by chemical vapor deposition (CVD). Gate conductor 31 is 1000–2000 Å high and 20–200 nm wide.

Figure 3:
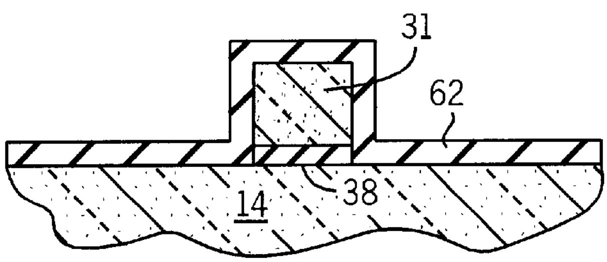
FIG. 3 is a schematic cross-sectional view of the portion of the integrated circuit illustrated in FIG. 2, showing a dielectric layer deposition step.

In FIG. 3, a high-K dielectric layer 62 (corresponding to layer 34 (FIG. 1)) is provided over main gate conductor 31. High-K dielectric layer 62 is preferably a 10–100 Å thick layer of silicon nitride, aluminum oxide, titanium oxide, tantalum pentoxide, or other high-K dielectric material, depending on the dielectric constant. High-K dielectric layer 62 is deposited by CVD or by a sputtering tool. Layer 62 has an EOT thickness 30–50% as thick as layer 38.

Figure 4:
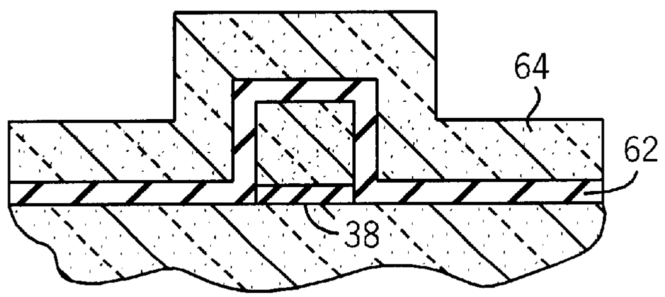
FIG. 4 is a schematic cross-sectional view of the portion of the integrated circuit illustrated in FIG. 3, showing a second gate electrode layer deposition step.

With reference to FIG. 4, a conductive layer 64 is provided over layer 62. Conductive layer 64 corresponds to U-shaped gate conductor 30 discussed with reference to FIG. 1. Layer 64 is preferably a 500–1000 Å thick conformal layer deposited by CVD or sputter deposition. Layer 64 can be a doped polysilicon, doped polysilicon/germanium, tungsten, titanium nitride, molybdenum, or other conductive layer.

Figure 5:
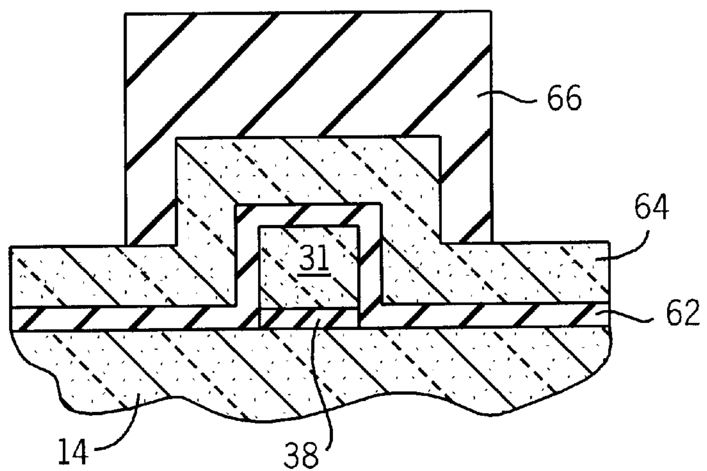
FIG. 5 is a schematic cross-sectional view of the portion of the integrated circuit illustrated in FIG. 4, showing a lithographic step.
Figure 6:
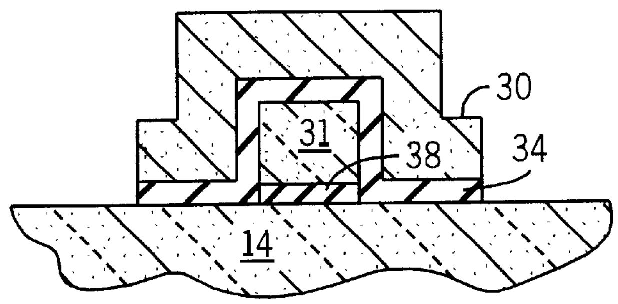
FIG. 6 is a schematic cross-sectional view of the portion of the integrated circuit illustrated in FIG. 5, showing a removal step for portions of the dielectric layer and the second gate electrode layer.

With reference to FIG. 5, a photolithographic process is utilized to etch layers 64 and 62. The lithographic process utilizes a selectively developed photoresist material 66 above layer 64. With reference to FIG. 6, layer 64 and 62 are etched to leave U-shaped gate conductor 30 and high-K gate dielectric layer 34. Material 66 is stripped after etching layers 64 and 62 in a conventional process.

Figure 7:
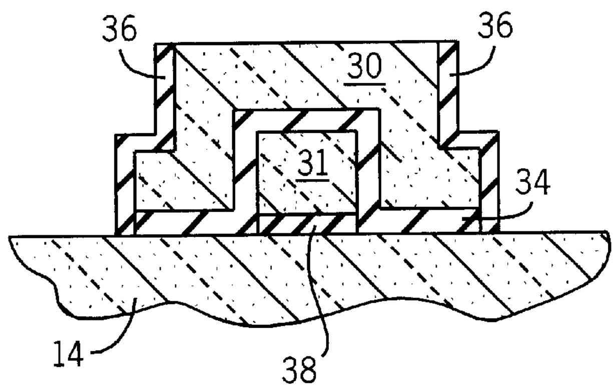
FIG. 7 is a schematic cross-sectional view of the portion of the integrated circuit illustrated in FIG. 6, showing a spacer provision step for the second gate electrode.

With reference to FIG. 7, spacers 36 are formed on lateral sides of conductor 30. Spacers 36 are preferably a medium- or low-K dielectric material. Spacers 36 can be an oxide material, such as, silicon dioxide. In addition, spacers 36 can be a silicon nitride material. Spacers 36 preferably have a height of 1500–3000 Å and a width of 300–500 Å. Spacers 36 can be formed in a conventional CVD and etchback process.

Figure 8:
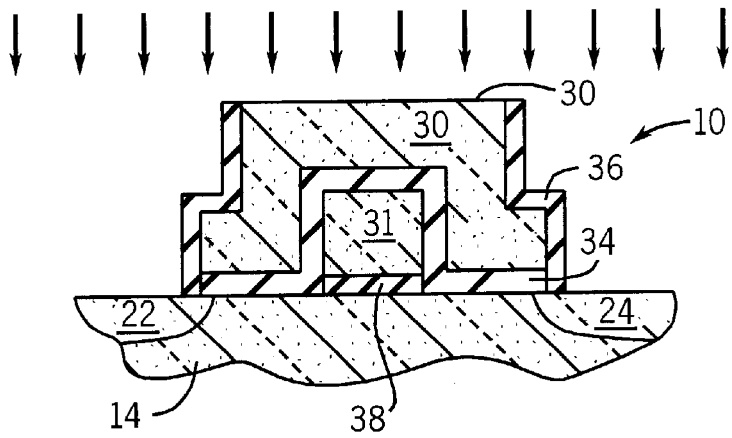
FIG. 8 is a schematic cross-sectional view of the portion of the integrated circuit illustrated in FIG. 7, showing a deep source and drain implant step.

With reference to FIG. 8, source region 22 and drain region 24 are formed in an implantation process. Preferably, an ion implantation process is utilized to simultaneously dope regions 22 and 24, and conductors 30 and 31. After doping, a rapid thermal anneal technique is utilized to activate dopants in conductors 30 and 31 as well as source region 22 and drain region 24. Alternatively, main conductor 31 can be deposited as a doped material or can be doped before etching or subsequent to etching.

With reference to FIG. 1, source region 22 and drain region 24 and conductor 34 are silicided in accordance with a conventional process. Conventional silicidation techniques can be utilized. For example, titanium silicide, cobalt silicide, tungsten silicide or other silicides can be formed by depositing a metal layer and reacting with the silicon of substrate 14 and conductor 30. Preferably, silicide layers 90, 92 and 94 are 200–400 Å thick.

In FIG. 1, gate structure 18 is designed such that the equivalent thickness with reference to thermal oxide layer 34 is 30% to approximately 50% that of gate dielectric layer 38 underneath center portion 44. Therefore, parasitic transistors (TS and TD) associated with U-shaped conductor 30 have lower threshold voltages than the main transistor (T) and will be turned on appropriately. Parasitic transistors (TS and TD) become inverted when the bias is provided to conductor 31. The inversion layer formed by the parasitic transistors (TS and TD) act as electrically induced source and drain extensions 23 and 25, respectively, for the main transistor (T).

In the alternative embodiment in which extensions 23 and 25 are dynamically formed, transistor 12 can be designed in such a way that the threshold voltage of the parasitic transistors (TS and TD) is less than the threshold voltage for the main transistor (T) and greater than zero for an N-channel transistor. [0<VTH (TS and TD)<VTH (T)]. Conversely, for a P-channel transistor, the threshold voltage of the parasitic transistors (TS and TD) is less than zero and greater than the threshold voltage for the main transistor (T). [VTH (T)<VT (TS and TD)<0]. Therefore, when the gate voltage equals 0 (for N-channel), both main transistor (T) and the two parasitic transistors (TS or TD) are turned off and source and drain extensions 23 and 25 (formed by deep inversion layers of the two parasitic transistors TS and TD) disappear. The off-state leakage current is smaller because of the larger physical space (channel length 27 is increased) between source region 22 and drain region 24.

It is understood that, while preferred embodiments, examples, materials, and values are given, they are for the purpose of illustration only. The apparatus and method of the invention is not limited to the precise details and conditions disclosed. For example, although a high-K dielectric material is mentioned, other materials can be utilized. Thus, changes may be made to the details disclosed without departing from the spirit of the invention, which is defined by the following claims.

What is claimed is:

1. A method of fabricating an integrated circuit on a substrate, the integrated circuit including at least one transistor with electrically induced source/drain extensions, the method comprising:

providing a first gate conductor on a substrate;

providing a dielectric layer over the first gate conductor; and providing a second gate conductor over the dielectric layer above the first gate conductor, the second conductor for forming the electrically induced source/drain extensions.

2. The method of claim 1, wherein the second gate conductor is a U-shaped gate electrode.

3. The method of claim 1, wherein the dielectric layer is a high-K dielectric material.

4. The method of claim 2, further comprising siliciding a top surface of the U-shaped conductor.

5. The method of claim 1, wherein the first gate conductor includes polysilicon.

* * * * *